United States Patent [19]

Sangster

[11] 4,001,862
[45] Jan. 4, 1977

[54] CHARGE TRANSFER DEVICE

[75] Inventor: Frederik Leonard Johan Sangster, Eindhoven, Netherlands

[73] Assignee: U.S. Philips Corporation, New York, N.Y.

[22] Filed: Nov. 12, 1975

[21] Appl. No.: 630,990

Related U.S. Application Data

[63] Continuation of Ser. No. 409,417, Oct. 25, 1973, abandoned.

[30] Foreign Application Priority Data

Mar. 19, 1973 Netherlands ............... 7303777

[52] U.S. Cl. ............... 357/24; 357/41; 357/43

[51] Int. Cl.² ............... H01L 29/78; H01L 27/02

[58] Field of Search ............... 357/24, 41, 43

[56] References Cited

UNITED STATES PATENTS

| | | | |
|---|---|---|---|
| 3,643,106 | 2/1972 | Berwin | 357/24 |
| 3,666,972 | 5/1972 | Sangster | 357/24 |
| 3,912,944 | 10/1975 | Mulder et al. | 357/24 |

Primary Examiner—Edward J. Wojciechowicz
Attorney, Agent, or Firm—Frank R. Trifari; Jack Oisher

[57] ABSTRACT

Variable capacitance bucket brigade memory in which variable capacitances are used instead of fixed capacitances in order to reduce the Signal-Step-Response-Error.

16 Claims, 13 Drawing Figures

CHARGE TRANSFER DEVICE

This is a continuation of application Ser. No. 409,417, filed Oct. 25, 1973, now abandoned.

The invention relates to a charge-transfer device, comprising a series of stages, which each include a first and a second capacitance, which are interconnected by the main current path of at least one transistor, the second capacitance of each stage at the same time constituting the first capacitance of the next stage, the input electrode circuit of the transistor including the first capacitance and the output electrode circuit of the transistor including the second capacitance, while a switching voltage source can be connected between the control electrode of the transistor and the terminal of the first capacitance which is remote from the input electrode circuit. In a known device of this type as described in "Digest of Technical Papers, I.E.E.E. Solid State Circuits Conference," 1970, pages 74, 75 and 185, the transistor is a field effect transistor. The control electrodes of the field effect transistors are interconnected in groups, thus forming junctions to which switching signals are applied, whose phase shift increases in the sequence of the numbers of the junctions.

In this known device the problem is encountered that when a large number of stages is employed the correct operation is disturbed owing to the fact that in each stage of the device the signals is slightly degraded. This becomes evident when observing the step response of the known device. This is intended to mean that when the input signal for example jumps from O volts to V volts, the output signal at the output of the device jumps from O to $(V - \delta)$ volts, $\delta$ being the error voltage. If the value of the input signal subsequently remains V volts, the output signal will also assume this value. Said effect adversely affects the frequency response of the device. Said signal degradation is, inter alia, caused by the fact that the threshold voltage of a transistor depends on the transferred signal value $\Delta V$. When a comparatively small number of stages are used, said adverse effect will be minimal or nil, but when a comparatively large number of stages are employed, for example a few hundred, the effect will present greater problems. The effect especially occurs when field-effect transistors are used for the transistors. This is owing to the fact that, on the one hand, electrostatic reaction takes place from the drain via the substrate to the channel between the source and the drain electrode of the field-effect transistor which is used and that, on the other hand, the length of the channel slightly depends on the voltage at the drain electrode. For field effect transistors having a high-ohmic substrate the electrostatic reaction is predominant, whereas in field effect transistors having a low-ohmic substrate, the second effect is predominant.

It is an object of the invention to provide a solution to the said problem and the invention is characterized in that the first and second capacitances in at least a number of stages are signal-dependent variable capacitances.

The invention is, inter alia, based on the recognition that the said signal degradation, also termed signal-step-response error (SSRE) in literature, during each charge transfer between the first and the second capacitance in each stage also depends on the quotient $C_1/C_2$, where $C_1$ is the capacitance value of the first capacitance and $C_2$ is the capacitance value of the second capacitance. In the previously described known device this quotient equals unity because $C_1 = C_2$. If in accordance with the invention during the charge transfer between a first and a second capacitance the value of the first capacitance is reduced and/or the value of the second capacitance is increased, $C_1/C_2 < 1$, the said SSRE is also reduced by this factor.

The invention will be described with reference to the drawing, where.

Figure 1:
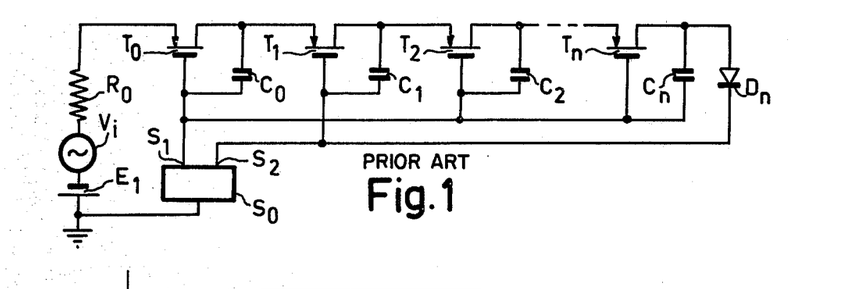
FIG. 1 represents a known charge transfer device.

In the device according to FIG. 1, which is a schematic of a known bucket-brigade type of charge-transfer device, the main current paths of the field-effect transistors $T_0, T_1, \ldots T_n$ are connected in series. The capacitance $C_0$ is included between the drain electrode and the gate electrode of the transistor $T_0$. The capacitance $C_1$ is included between the drain and the gate of the transistor $T_1$. The capacitance $C_n$ is interposed between the drain and the gate of the transistor $T_n$. The gate electrode of the transistor $T_1$ is connected to the output $S_2$ of the switching voltage source $S_0$. The gates of the transistors $T_0$ and $T_n$ are connected to the output $S_1$ of the switching voltage source $S_0$. One end of the diode of $D_n$ is connected to the drain of the transistor $T_n$ and the other end is connected to the output $S_2$ of the switching voltage source $S_0$. The source electrode of the transistor $T_0$ is connected to a point of constant potential via the series of connection of the resistor $R_0$, the input voltage source $V_i$ and the direct voltage source $E_1$. Each transistor and similarly numbered capacitor constitutes a temporary storage site for charge carriers in this device. The operation of the known device will be described with reference to FIG. 2.

Figure 2:
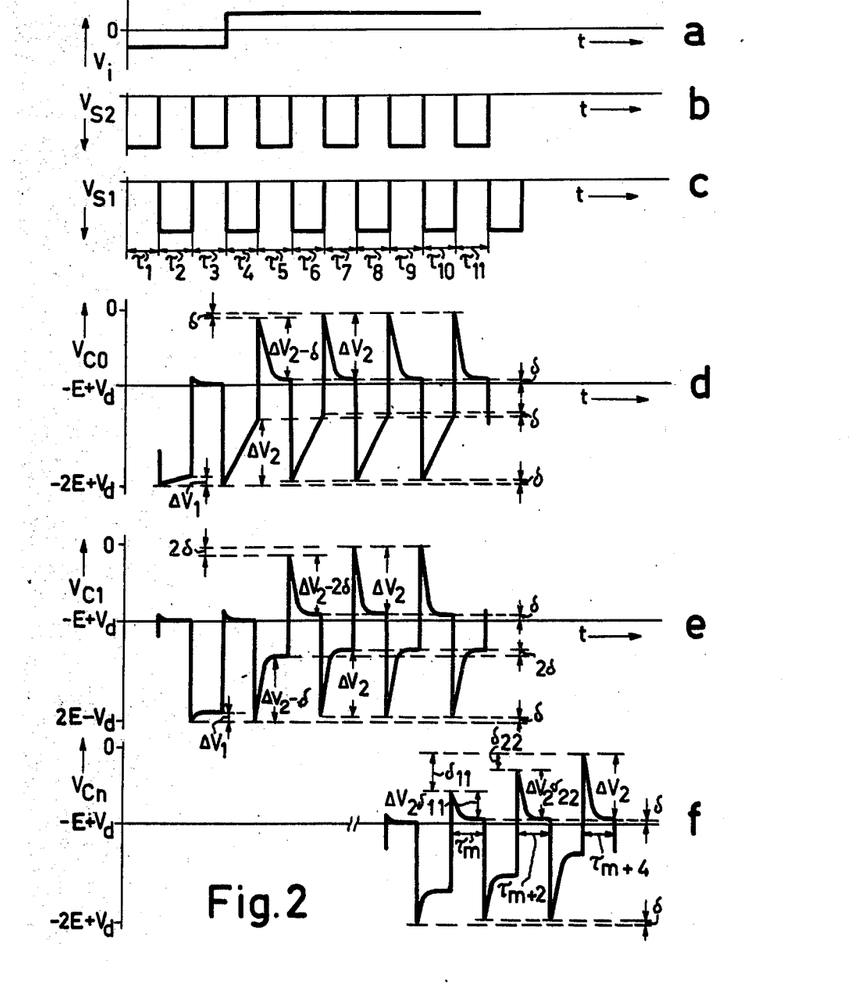
FIG. 2 represents the voltages appearing at different points in the known device as a function of time.

In FIGS. 2a and 2b respectively, the voltages appearing at the outputs $S_2$ and $S_1$ are represented as a function of time. They are symmetrical clock voltages having a maximum of 0 volts and a minimum of -E volts. During the time that the voltage at point $S_1$ is negative relative to earth, information concerning the magnitude of the input signal $V_1$ is transferred to the capacitance $C_0$, i.e. during the time intervals $\tau_2$, $\tau_4$, $\tau_6$ and $\tau_8$ in FIG. 2b. In the time interval $\tau_2$ the input signal $V_i$ is small, whereas in the time interval $\tau_4$ and subsequently the input signal $V_i$ is large. In the time interval $\tau_2$ there will be a current in the transistor $T_0$, which approximately equals $V_i/R_0$ amperes. Here, $V_i$ is the magnitude of the input signal in the time interval $\tau_2$ under consideration and $R_0$ the value of the resistance $R_o$ of FIG. 1. This current will cause the voltage at the drain of the transistor $T_0$ to increase by an amount $\Delta V_1$, see FIG. 2d. In the time interval $\tau_3$ the capacitance $C_0$ is discharged via the transistor $T_1$ until the voltage across said capacitance has become equal to $-(E-V_d)$ volts, Where $V_d$ is the threshold voltage of the transistor $T_1$, the magnitude of said threshold voltage being also determined by the signal value $\Delta V_1$. In the time interval $\tau_4$ a charge is supplied again via the transistor $T_0$ to the capacitance $C_0$, so that the voltage at the drain of transistor $T_0$ will increase by an amount $\Delta V_2$ volts, see FIG. 2d. In the time interval $\tau_5$ the capacitance $C_0$ is discharged via the transistor $T_1$ until the voltage across said capacitance equals $-(E-V_d')$ volts, $V_d'$ being the threshold voltage of the transistor $T_1$ associated with the signal value $\Delta_2$. It has been found that the threshold voltage $V_d'$ associated with the signal value $\Delta V_2$ is an amount of $\delta$ volts higher than the threshold voltage $V_d$ associated with the signal value $\Delta V_1$. This means that the voltage decrease across the capacitance $C_0$ during the time interval $\tau_5$ will equal $(\Delta V_2 - \delta)$ volts instead of $\Delta V_2$. At the instant that the time interval $\tau_6$ commences, the voltage at the drain of the transistor $T_0$ will equal $-(2E - V_d) + \delta$ volts, see FIG. 2d. At the end of the said time interval the voltage at the drain of the transistor $T_0$ will equal $-(2E-V_d) + \delta + \Delta V_2$ volts. In said time interval the voltage decrease across the capacitance $C_0$ therefore equals $\Delta V_2$ volts.

In the time interval $\tau 3$ the capacitance $C_1$ is charged via the transistor $T_1$ until the voltage across said capacitance has increased by an amount of $\Delta V_1$ volts, see FIG. 2c. In the time interval $\tau_4$ the capacitance $C_1$ is discharged via the transistor $T_2$ until the voltage across the capacitance equals $-(E-V_d)$ volts, $V_d$ being the threshold voltage of the transistor $T_2$ associated with the signal value $\Delta V_2-2\delta$. In the time interval $\tau_5$ the capacitance $C_1$ is charged via the transistor $T_1$. The voltage rise aross the capacitance $C_1$ will then equal the voltage drop across the capacitance $C_0$ in the time interval under consideration. The said voltage rise will consequently equal $(\Delta V_2 - \delta)$ volts. In the time interval $\tau_6$ the capacitance $C_1$ is discharged via the transistor $T_2$ until the voltage across this capacitance equals $-(E-V_d'')$ volts, $V_d$ being the threshold voltage of the transistor $T_2$ associated with the signal value $(\Delta V_2-\delta)$. As $\delta$ is substantially smaller than $\Delta V_2$, $V_d'' = V_d'$ is a very close approximation. This means that the voltage drop across the capacitance $C_1$ in the time interval $\tau_6$ will equal $(\Delta V_2 - 2\delta)$ volts instead of $\Delta V_2$ volts, which it ought to be. A simple calculation reveals that the voltage drop across the capacitance $C_n$ corresponding to the voltage drop $(\Delta V_2 - \delta)$ volts across the capacitance $C_0$ in the time interval $\tau_5$ will equal $(\Delta V_2 - n.\delta)$ volts, n being the sequence number of the capacitance $C_n$. However, this is true only when $n.\delta$ is small relative to $\Delta V_2$. If $n.\delta$ becomes comparable with $\Delta V_2$, i.e. when n is selected greater, the corresponding voltage drop will equal $(1 - \delta)$ n volts. This may then also give rise to second and third order effects. This means that in contradistinction to the examples discussed with reference to FIGS. $2_d$ and $2_c$ where only one signal value was not correct (see FIG. 2d, interval $\tau_5$ and FIG 2c, interval $\tau_6$), two or more consecutive signal values will not be correct as is schematically indicated in FIG. 2f. In this Figure the signal values in the intervals $\tau_m$ and $\tau_{m+2}$ are not correct. In the interval $\tau_m$ the signal value equals $(\Delta V_2 - \delta_{11})$ volts and in the interval $\tau_{m+2}$ the signal value equals $(\Delta V_2 - \delta_{22})$ volts. The signal value will not be correct and equal $\Delta V_2$ volts until the time interval $\tau_{m + 4}$.

In the known charge transfer devices of this type the storage capacitances $C_0$ to $C_n$ have a virtually constant value. However, according to the invention the capacitances $C_0$ to $C_n$ in a device as shown in FIG. 1 are signal-dependent variable capacitances. This enables the said error voltage $\delta$ to be reduced.

Figure 3:
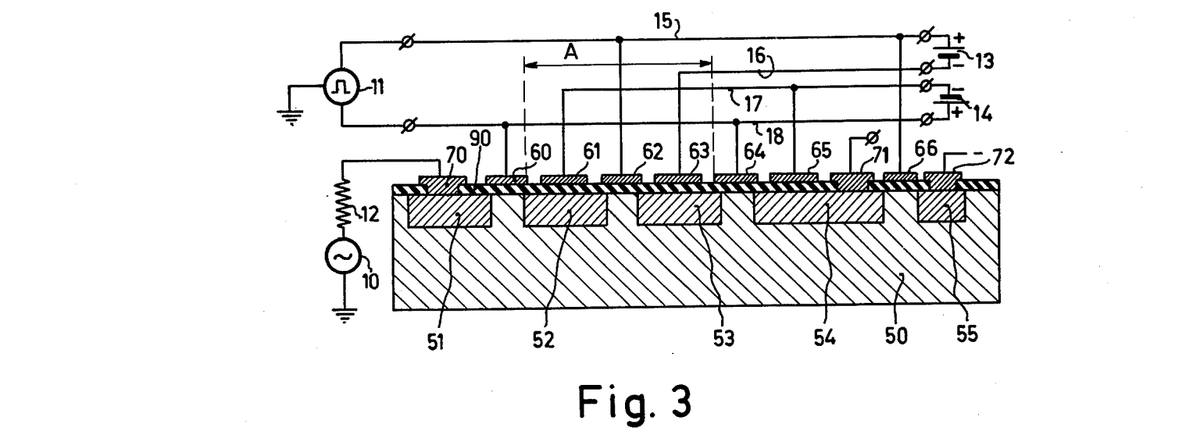
FIG. 3 is a cross-section of an integrated charge-transfer device according to the invention.
Figure 4:
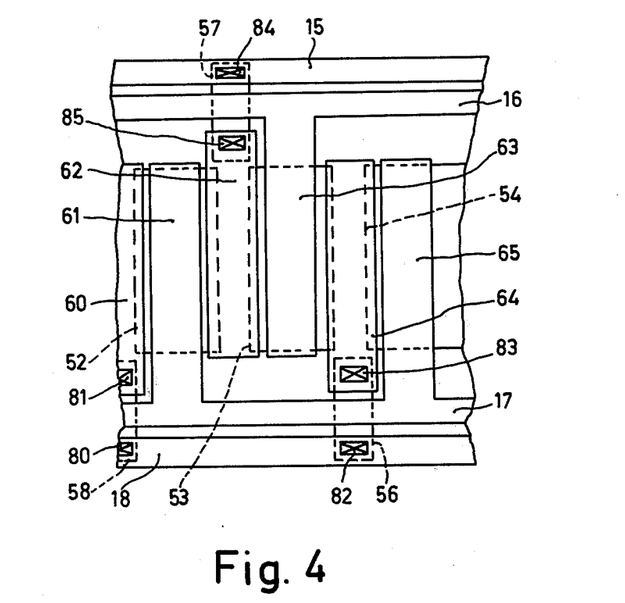
FIG. 4 is a top-plan view of an integrated semiconductor device according to the invention.

An example of a practical embodiment of such a device with variable and in particular voltage dependent capacitances is schematically represented in FIGS. 3 and 4.

The semiconductor device of FIGS. 3 and 4 comprises a substrate 50, which may be of an insulating material, provided with one or more surface regions of a semiconductor material, or which may consist of a semiconductor material as in the relevant embodiment. In a surface region of the substrate 50, which may for example be N-type, a series of p-type semiconductor zones 51, 52, 53, 54 and 55 are provided. The semiconductor zones 51, 52, 53, 54 and 55 in conjunction with overlying conducting layers or electrodes 60, 62, 64 and 66 on an insulator 90 constitute a series of field effect transistors whose main current paths are series-connected. The semiconductor zones 52, 53 and 54 together with the conducting layers 61, 63, and 65 situated above them at the same time constitute so-called depletion capacitances of the type as, for example, described in "Solid State Electronics" Pergamon Press, 1965, Vol. 8, pages 153 and 154. The semiconductor zone 51 is connected via the contact 70 to the series connection of the resistor 12 and the input signal source 10. The semiconductor zone 54 is provided with a contact 71, at which the output signal is available. The semiconductor zone 55 is connected to a contact 72, which may be connected to a negative voltage or to the gate electrode 66. The gate electrodes 60 and 64 are connected to the clock conductor 18 and the gate electrodes 62 and 66 are connected to the clock conductor 15. The conducting layers 61 and 65 are connected to the clock conductor 17. The conducting layer 63 is connected to the clock conductor 16. A switching voltage or clock source 11, which controls the charge transfer, is included between the clock conductors 15 and 18. A direct voltage source 13 is included between the clock conductors 15 and 16 and a direct voltage source 14 is included between the clock conductors 17 and 18. FIG. 4 shows how the conducting layers 60, 62 and 64 are connected to their respective clock conductors. The conducting layer 60 is connected via the contact 81 to a semiconductor zone 58, which passes underneath the conductor 17, which zone via the contact 80 is connected to the clock conductor 18. The conducting layer 62 is connected via the contact 85 to the semiconductor zone 57, which zone via the contact 84 is connected to the clock conductor 15. Via the contact 83 the conducting layer 64 is connected to the semiconductor zone 56, which zone, via the contact 82, is connected to the clock conductor 18.

The semiconductor device of FIGS. 3 and 4 can be manufactured fully in accordance with conventional semiconductor techniques. The substrate may, for example, consist of n-type silicon. The P-type zones 51, 52, 53, 54 and 55 may, for example, be realized with the aid of ion implantation and may for example have a surface doping concentration of the order of magnitude of $10^{16}/cm^3$. The insulating layer 90 is, for example, of silicon oxide and/or silicon nitride and underneath the gate electrodes 60, 62, 64 and 66 it is, for example, 0.1 to 0.2 μm thick. Outside the channel regions of the field effect transistors and outside the parts of the insulating layer which are situated above the zones 52, 53 and 54 which are covered by the conducting layers 61, 63 and 65, the insulating layer should preferably be thicker than 1 μm (not shown). In order to prevent the undesired formation of channels, it is further possible to provide channel stoppers, for example, diffused channel stoppers.

Figure 5:
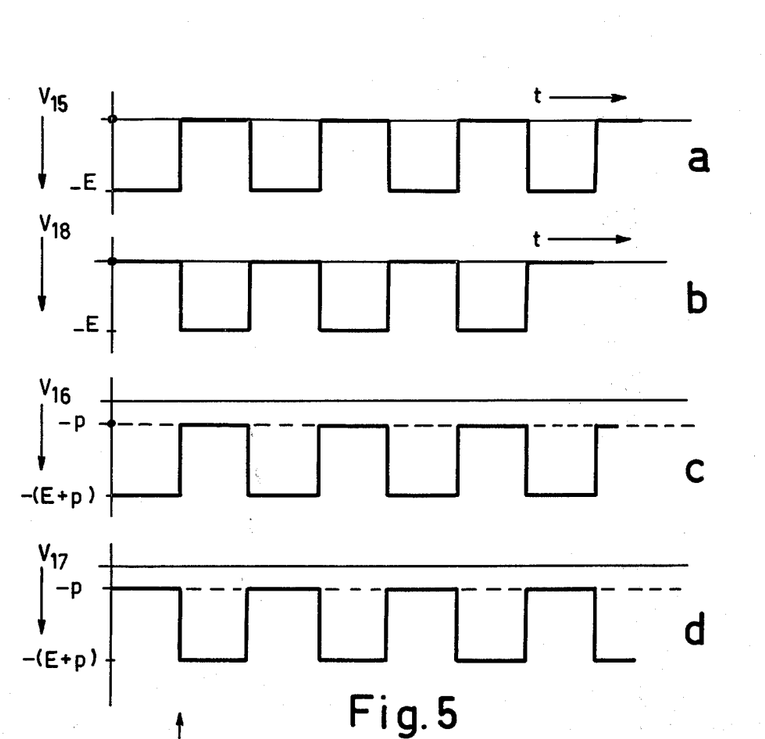
FIG. 5 is a waveform diagram of the signals to be applied to the clock lines in the device according to FIGS. 3 and 4.
Figure 6:
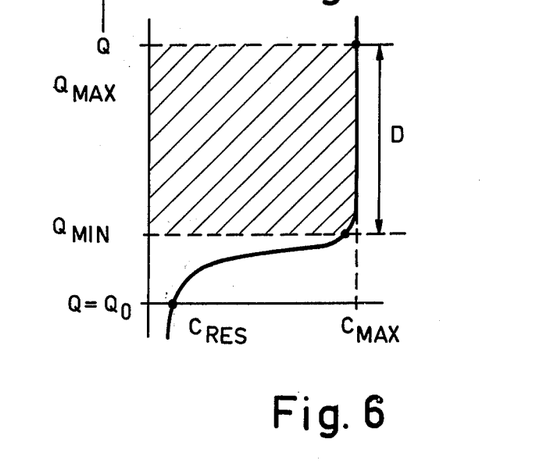
FIG. 6 represents the depletion capacitances used in the device according to FIGS. 3 and 4 as a function of the signal charge contained therein.

The switching voltage source 11 supplies signals of the shape shown in FIG. 5a and 5b. In FIG. 5a the voltage of the clock conductor 15 is plotted as a function of time and in FIG. 5b the voltage at the clock conductor 18 is shown as a function of time. In FIG. 5c the voltage at the clock conductor 16 is shown as a function of time and in FIG. 5d the voltage at the clock conductor 17 is shown as a function of time. In FIGS. 5c and 5d p is the magnitude of the bias voltages provided by the direct voltage sources 13 and 14. By means of the said bias voltages, the depletion capacitances 61-90-52, 63-90-53, 65-90-54 are preferably biassed so that when these capacitances contain signal information charges the values of the said capacitances is maximum, whereas the values of these capacitances are minimum when the capacitances carry only reference charges and no signal charge. This is illustrated by FIG. 6. In this Figure the information charge is plotted on the vertical axis and the capacitance value on the horizontal axis. Between the values $Q_{MAX}$ and $Q_{MIN}$, also called dynamic range D, the information charge may assume any value at a virtually constant capacitance $C_{MAX}$. When after a charge transfer operation the information charge from a first depletion capacitance has been transferred to a second depletion capacitance, the value of the first depletion capacitance declines and preferably equals $C_{RES}$ and the value of the second depletion capacitance equals $C_{MAX}$. The reduction of the signal degradation will now equal $C_{MAX}/C_{RES}$. In this respect it is to be noted that at the beginning of the charge transfer the quotient $C_2/C_1$ is great, so that there will be a substantial reaction. However, this part of the charge transfer hardly affects the said signal degradation, which is mainly determined by the last part of the charge transfer. An additional advantage of the to the invention is the fact that the discharge process for the last charge from the depletion capacitance is effected more rapidly, because the discharge time constant, which is proportional to the capacitance value of the relevant depletion capacitance, also decreases during the transition from $C_{MAX}$ $C_{RES}$. As a result, the device according to FIG. 3 can be operated at higher clock frequencies than the known device having constant capacitances. To summarize the operation, with respect to FIG. 6 of the referenced "Solid State Electronics" article, the conditions are set such that when signal carriers (holes in the P zones) accumulate in the P zones, the MOS depletion capacitance is high, whereas when the signal carriers are transferred out of the P zones, their surface deplete producing a low (high frequency) capacitance. Thus, the storage capacitance varies between depletion and accumulation in accordance with the absence and presence, respectively, of signal carriers. Instead of the MOS depletion capacitances shown in FIG. 3 it is also possible to employ pn-junction capacitances. Further, the capacitance of Schottky barriers may, for example, be employed.

By a suitable choice of the doping concentration and the zone depth of zones 52–54, $C_{RES}$ can be made to approximate to the overlap (Miller) capacitance between the gate electrodes of the adjacent field effect transistor and the relevant zone, as a result of depletion zones during operation being formed underneath the conducting layers 61, 63 and 65 which depletion zones extend over the entire thickness of the zones 52, 53 and 54.

Figure 7:
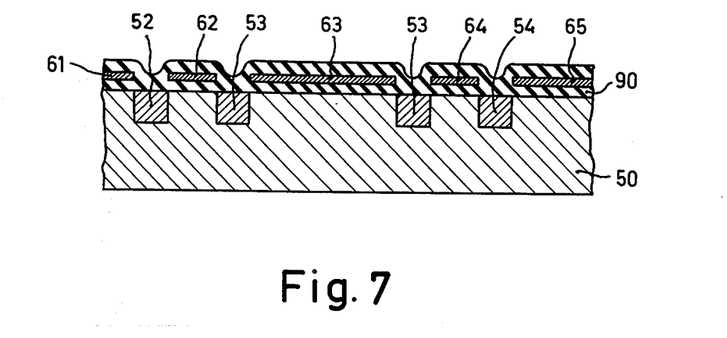
FIG. 7 is a cross-section of another integrated embodiment of the charge-transfer device according to the invention.
Figure 8:
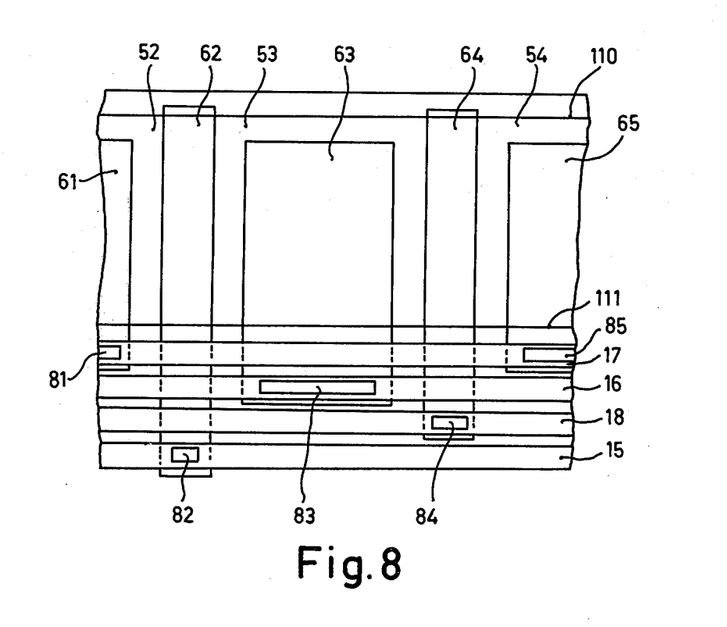
FIG. 8 is a top-plan view of the embodiment of FIG. 7.

Instead of the MOS depletion capacitances employed in the charge transfer devices of FIGS. 3 and 4, it is also possible to employ so-called inversion capacitances as voltage-dependent capacitances. An embodiment of a charge transfer device according to the invention, employing an inversion capacitance as a voltage dependent capacitance, is shown in FIGS. 7 and 8. The semiconductor device according to these Figures comprises a substrate 50, which may be of an insulating material, which is provided with one or more surface regions of a semiconductor material or which may for example consist of a semiconductor material as is the case in the relevant embodiment. In the surface region of the substrate 50 a series of semiconductor zones 52, 53 and 54 are provided. For example, the zones 52–54 may be P-type in an N-substrate 50. The zones 52 and 53 together with the conductor plate 62 form a first field-effect transistor. The zones 53 and 54 together with the conductor plates 64 form a second field effect transistor. The conductor plate 62, which is also the control electrode of the first field effect transistor, is connected via the contact hole 82 to the clock conductor 15. The conductor plate 64, being also the control electrode of the second field effect transistor, is connected to the clock conductor 18 via the contact hole 84. The conductor plate 63 forms one plate of an inversion capacitance and is connected to the clock conductor 16 via the contact hole 83. The conductor plate 61 forms one plate of a preceding inversion capacitance and is connected to the clock conductor 17 via the contact hole 81. The conductor plate 65 constitutes one plate of a subsequent inversion capacitance and is connected to the clock conductor 17 via the contact hole 85. The conductor plates 61, 62, 63, 64 and 65 may, for example, be made of aluminum. However, polycrystalline silicon with a suitably selected impurity may be used to advantage.

The operation of the integrated charge transfer device according to FIGS. 7 and 8 is as follows. To the clock conductors 15, 16, 17 and 18 clock signals of the type shown in FIG. 5 are applied. The storage capacitance associated with the first field-effect transistor, in the absence of an inversion layer underneath the capacitance electrode 63, is constituted by the so-called overlap capacitance which exists between the electrodes 62 and 63 and the zone 53. Since, as is known, in silicongate technology the conducting layers 61 through 65 are also used as a mask when applying the zones 52 through 54, this overlap capacitance will be comparatively small. The minimum capacitance $C_{RES}$, which the variable storage capacitance may assume, is also determined by said overlap capacitance. When an inversion layer is present at the surface of the substrate 50 underneath the conducting layer 63, between the conducting layer 63 and the substrate 50, a relatively high capacitance is present, being in parallel with the said overlap capacitance. The capacitance value of the variable storage capacitance is then maximum and equals $C_{MAX}$. The bias voltage p in FIG. 5 is now selected so that if the said variable capacitance carries an information charge, the value of the capacitance is maximum and remains maximum until said capacitance has transferred this information charge to a following variable storage capacitance. Briefly before the storage capacitance is brought to reference level, the storage capacitance assumes its minimum value $C_{RES}$. In a similar way as described previously for the depletion capacitances in the device of FIG. 3, the said error voltage δ will have decreased by a factor which substantially equals $C_{MAX}/C_{RES}$. By suitable proportioning the said device the magnitude of the said reduction can be adjusted as desired within reasonable limits. A reduction by a factor of 10 to 15 is readily attainable.

If one compares the known charge transfer device with the FIG. 3 and 7 embodiments, it will be recognized that in these embodiments of the present invention, each electrode of the known device has been electrically divided into two parts: a first part such as 62 serving mainly as a transfer gate, and a second part such as 63 serving mainly as one electrode of an information dependant, variable capacitor, the other electrode of which is the underlying semiconductor. The electrical division allows the application of different voltages to the first and second parts to enable carrying out of their different functions.

Figure 9:
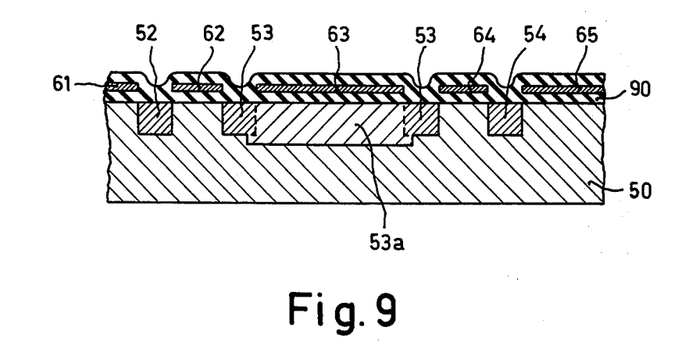
FIG. 9 is a schematic cross-section of a modification of the device according to FIGS. 7 and 8.

In the embodiment of the charge transfer device described with reference to FIGS. 7 and 8 inversion capacitances are employed. However, it is equally possible to use depletion capacitances in the said embodiment. For this purpose, as is schematically shown in the cross-section of FIG. 9, a moderately doped P-type zone 53a is, for example, provided underneath the conductor plate 63, which zone is of the same conductivity type as the zone 53.

In the embodiment of FIG. 8, the field effect transistors and the capacitances lie within the lines 110 and 111 in FIG. 8. Outside these lines a thick insulating layer is present, for example, in the form of an insulating layer which is sunk in the semiconductor body over at least part of its thickness. Such an inset insulating layer can be obtained in a known manner by local oxidation of the semiconductor body 50. The surface zone 53 is u-shaped, the legs of the u-shape respectively forming the drain electrode of the transistors 52, 62, 53 and the source electrode of the transistors 53, 64, 54. The strip zone 53 substantially surrounds that part of the surface region of the substrate 50 which is covered by the capacitance electrode.

The conducting layers 62 and 63 are self-registering layers, i.e. layers which when applying the surface zones 52, 53 and 54 are used as a mask. As a result, the capacitance electrode is situated almost completely above the substrate 50.

Figure 10:
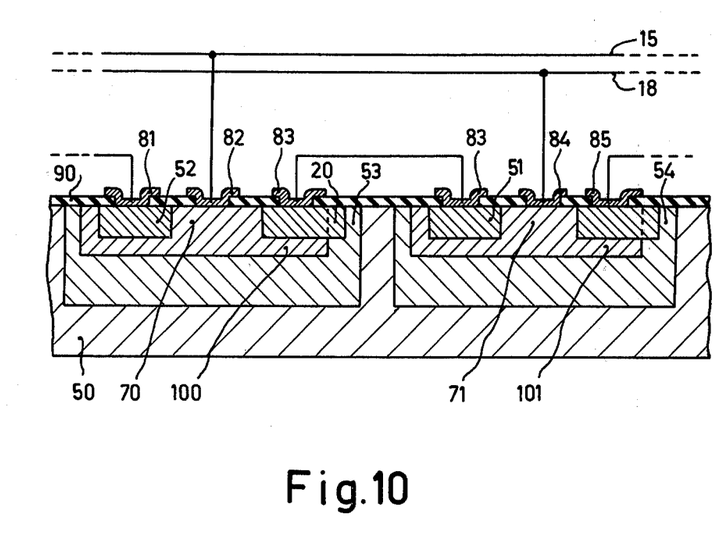
FIG. 10 is a schematic cross-section of a further embodiment.

In the embodiments described so far field effect transistors are employed as electronic switches. However, it is also possible to employ bipolar transistors as electronic switches. FIG. 10 shows an integrated embodiment of this. In this embodiment a series of two bi-polar transistors is integrated in a semiconductor body 50. A first transistor is formed by the zones 52, 53 and 70. The zone 52 is the emitter zone, the zone 53 is the collector zone and the zone 70 is the base zone. The second transistor is constituted by the zones 51, 54 and 71. The zone 51 is the emitter zone, the zone 54 is the collector zone and the zone 71 is the base zone of the second transistor. Via a heavily doped zone 20 and the contact 83 the collector zone of the first transistor is connected to the emitter zone 51 of the second transistor. The base zone 70 which adjoins the surface of the semiconductor body 50 surrounds the emitter zone 52 which is adjacent to the surface of the body 50. The said base zone 70 is adjacent to the collector zone 53 of the first transistor. The surface zone 20 has been provided to increase the base-collector capacitance of the first transistor. This surface zone 20 is directly connected to the collector zone, while the base zone 70 is situated adjacent to the said surface zone 20, forming a pn-junction therewith. The base zones 70 has an intermediate portion 100 which extends between the collector zone 53 and at least part of the surface zone 20. The thickness and doping concentration of the intermediate portion 100 are such as to enable the formation of a depletion zone over the entire thickness of the intermediate portion 100 without the occurrence of breakdown. The second transistor is constructed in a similar way as described herein before for the first transistor. For example, the base zones 70 and 71 of the first and the second transistor have a doping concentration of $10^{16}$ atoms/cm³. Owing to the heavy doping of the zone 20 and the relatively light doping of the base zone 70, the portion of the collector-base junction between the base zone 70 and the surface zone 20 will constitute the major part of the collector-base capacitance of the first transistor. When the intermediate portion 100 is fully depleted, the remaining collector-base capacitance will consequently be low and equal the previously stated $C_{RES}$. When the intermediate portion is not depleted, the collector-base capacitance will be high and equal the previously stated $C_{MAX}$. The resultant reduction of the previously stated error voltage δ, will also be approximately $C_{MAX}/C_{RES}$ in this example.

For completeness, reference is made to copending Patent Application, Ser. No. 462,974, filed Apr. 22, 1974 in wich integrated charge transfer devices using bipolar transistors as described comprehensively. In particular, this Application also provides a layout or topology of a device using transistors with increased base collector capacitances having a structure as herein described with reference to FIG. 10, the zone 20 overlapping a substantial part of the base zone 70 and the associated part of the pn-junction 60 constituting up to 80% of the collector-base capacitance. However in said copending application, the zone doping and applied potentials do not enable the formation of a depletion zone over the entire thickness of the intermediate portion 100, as is described in the present case, which then readily enables a reduction of the base-collector capacitance by a factor of 3 to 5.

Figure 11:
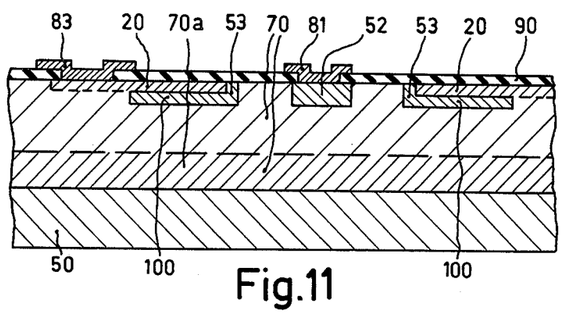
FIG. 11 is a schematic cross-section of a different embodiment.

In the said copending Application, Ser. No. 462,974, there is also described an embodiment using so-termed lateral bipolar transistors. The transistors used therein have a cross-section as schematically shown in FIG. 11. The emitter zone 52 is surrounded by a collector zone 53, these zones being surface zones which extend from the surface into a region 70 of an opposite conductivity type which constitutes the base zone of the transistor. The base zone 70 is provided with a more heavily doped buried layer 70a in order to reduce the series resistance. At the surface a further surface zone 20 is provided to increase the collector-base capacitance, which zone 20 covers a substantial portion of the annular collector zone 53. In contradistinction to the previous example, the further surface zone 20 here forms part of the base zone 70, while the intermediate portion 100, in which during the charge transfer a depletion zone is formed in the manner described, belongs to the collector zone 53. As in the embodiment of FIG. 10, the doping level of zone 100 is chosen to be fully depleted to reduce the base-collector capacitance when the signal carriers are transferred out.

Figure 12:
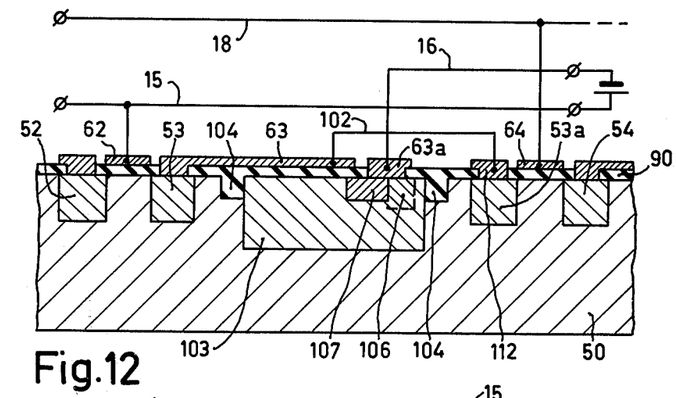
FIG. 12 is a schematic cross-section of yet another embodiment.

The embodiment of FIG. 12 shows two of a sequence of series-connected field-effect transistors. The first transistor is constituted by the surface zones 52 and 53, which serve as source and drain electrodes, and the gate electrode 62, which extends above the channel region situated between the zones 52 and 53. The second transistor following the first one is formed in a corresponding manner by the surface zones 53a and 54 and the gate electrode 64.

In contrast with previous examples, the drain electrode 53 of the first transistor, the surface zone 103 of the variable capacitance and the source electrode 53a of the next transistor are not combined to one continuous surface region. The two zones 52 and 53 are interconnected, which is schematically represented by a connection 102 between the conducting layer 63 and the conducting layer 112 which contacts the zone 53a. The surface zone 103 of the capacitance is a surface zone of the same conductivity type as the zones 52, 53a, 53 and 54 which are surrounded by an inset insulating layer 104. The surface concentration of the said zone 103 is $10^{17}$ atoms/cm$^3$ at the most and is preferably between $10^{14}$ and approximately $10^{16}$ atoms/cm$^3$. Via a more heavily doped contact zone 106 and the conducting layer 63a the zone 103 is connected to a clock conductor 16. The capacitance electrode is constituted by the conducting layer 63 which is connected to the zone 53, the layer 63 being isolated from the surface zone 103 by the insulating layer 90. In this case the voltage-dependent capacitance is an inversion capacitance. The previously stated bias voltage is now adjusted so that when a high capacitance value is required, an inversion layer is present underneath the conducting layer 63 in the surface zone 103, the said inversion layer being absent when a low capacitance value is required. To enable a rapid build-up of the inversion layer a surface zone 107 of the same conductivity type as the substrate is provided, the pn-junction between the said zone 107 and the zone 103 at the surface being short-circuited by the conducting layer 63a. The surface zone 107, on the one hand, serves for rapidly supplying the charge carriers required for building up the inversion layer and, on the other hand, constitutes the connection between the conducting layer 63a and the inversion layer, which at a high capacitance value takes over the function of second electrode of the capacitance from the zone 103.

Figure 13:
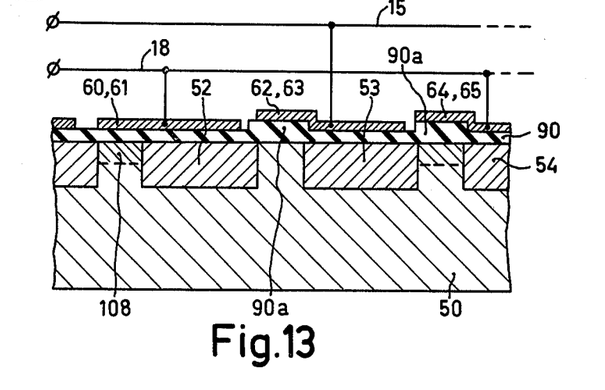
FIG. 13 is a schematic cross-section of a modification of the device of FIG. 3.

In the embodiments using field-effect transistors described so far, four clock lines are employed, the capacitance electrodes being connected to respective clock conductors 16 and 17. By means of the direct voltage sources 13 and 14 the respective capacitances are appropriately biassed. FIG. 13 shows in a variation of FIG. 3 that it is also possible to employ two clock conductors 15 and 18 only. The capacitance electrode 61 is a conducting layer which is isolated from the surface zone 52 by the insulating layer 90, which constitutes a barrier. Preferably, substantially the entire part of the surface zone 52 respectively 53, which is situated underneath the capacitance electrode 61 should have a doping concentration of $10^{17}$ atoms/cm$^3$ at the most. Preferably, the maximum doping concentration is between approximately $10^{14}$ and approximately $10^{16}$ atoms/cm$^3$. The doping is selected so that a depletion zone can be formed over the entire thickness of the said surface zone 52 (53) without the occurrence of breakdown. In the embodiment of FIG. 13 the capacitance electrodes 61, 63 and 65 are connected to the gate electrodes 60, 62 and 64 of the field-effect transistors of the same stage in that they are constituted by continuous conducting layers 60, 61, 62, 63 and 64, 65. FIG. 13 schematically shows that on the one hand, by providing the region of the second conductivity type, the substrate 50, at the location of the channel regions of the field-effect transistors with portions 108 adjacent to the surface which have a higher doping concentration than the parts of this region located there beneath and, on the other hand, by providing underneath the gate electrode an insulating layer portion 90a having a greater thickness than the insulating layer underneath the capacitance electrode, two clock conductors may be dispensed with. It is obvious that both steps may be combined in one and the same field effect transistor. Similar steps may also be used in the embodiments having inversion capacitances, where in general it is possible to replace the external bias entirely or partly by an "internal" difference between the threshold voltage which is required for the formation of the conducting channel of the field effect transistors and the threshold voltage which is required for the formation of the inversion layer of the storage capacitance. Such "internal" bias voltages can also be obtained by the use of insulating layers having different dielectric constants and by the use of conducting layers of materials having a different work function.

It is to be noted that the invention is not limited to the embodiments described and that to those skilled in the art many variations are possible within the scope of the invention. As an example, shorter or longer chains of transistors may be employed, compensation of the resultant losses if any, being effected by the inclusion of one or more charge amplifiers. It is also possible to connect several chains of transistors in parallel, using a common input and/or a common output. Further, conventional sampling circuits and/or output circuits may be used, which like the charge amplifiers, if any, fully or partly may be integrated in the same semiconductor body together with the charge transfer device. These and other possibilities are for example described in U.S. Pat. Nos. 3,546,490, and 3,745,383, and in copending U.S. Application Ser. No. 462,974, filed Apr. 22, 1974, Ser. No. 173,249, filed Aug. 19, 1971; and Ser. No. 304,391, filed Nov. 7, 1972.

Besides electrical signals, it is further also possible to employ input signals of a different nature, for example electromagnetic signals. As an example, use can be made of the photosensitivity of the base-collector junction of a transistor.

In the charge transfer device it is alternatively possible to employ field-effect transistors having a gate electrode which is isolated from the channel region by a rectifying junction, while in addition to the insulated-gate field-effect transistors of the enhancement type here described, it is equally possible to use those of the depletion type.

The voltage-dependent storage capacitances of a charge transfer device need not be identical to each other, neither as regards their value nor their structure.

In the integrated embodiments materials other than those described may be used. As a semiconductor material for example germanium or an $A_{III}B_V$- compound may be employed. Apart from the said polycrystalline semiconductor material the various conducting layers may also consist of molybdenum or tungsten or of composite layers such as titanium-platinum-gold. The gate electrodes also may consist of a different material than that of the capacitance electrode and/or the clock conductors.

The said maximum concentration of the surface zone associated with the variable capacitance will generally equal or substantially equal the surface concentration of this zone. This also applies to substantially homogeneously doped surface zones such as can be obtained in a known manner by ion implantation.

In the examples the gate electrodes and the capacitance electrodes are connected in a groupwise fashion so as to obtain two junctions. However, it is equally possible to divide the electrodes into more than two groups.

What is claimed is:

1. A charge transfer device comprising a series of stages each including first and second charge storing capacitances and at least one transistor having a control electrode and interconnecting by a main current path said first and second capacitances, said second capacitance of each stage constituting the first capacitance of the next stage, means for introducing mobile charge carriers representing signal information into at least one of the stages, and means for applying switching voltages to the control electrodes for causing serial transfer of mobile charge carriers representing signal information temporarily stored in capacitances to succeeding capacitances in a predetermined direction through the series of stages, at least one of the first and second capacitances of a plurality of said stages comprising means forming a first capacitance portion being responsive to the presence of stored signal carriers and having a high value when signal carriers are present and having a substantially lower value in the absence of signal carriers, said transistors being bipolar transistors having emitter, base and collector zones with the control electrode being the base zone of the transistor, said first capacitance portion comprising the junction capacitance between the base and collector zones and a further zone connected to one of the base and collector zones and increasing the base-collector junction capacitance, said other of the base and collector zones having an intermediate portion with a thickness and a doping concentration such that when the switching voltage is applied the intermediate portion can be depleted over its entire thickness resulting in said lower value of capacitance in the absence of signal carriers.

2. A charge transfer device as claimed in claim 1 wherein the doping concentration of the intermediate zone is $10^{17}$ atoms/cm$^3$ or less.

3. Charge transfer apparatus of the type adapted for temporary storage at a plurality of storage sites and serial transfer through the sites in a predetermined direction of varying amounts of mobile charge carriers representing signal information, comprising a semiconductive region of one type conductivity and having a major surface, an insulating layer disposed over and contiguous with the surface, a plurality of electrodes disposed over said layer so as to form a path along which said mobile charge carriers can be transferred through the semiconductive region in said predetermined direction in response to successively applied voltages applied to said electrodes, a plurality of spaced surface zones of a conductivity type opposite to that of said one type located in the semiconductor region along said path under the electrodes, each storage site comprising one of said surface zones, a first transfer electrode portion bridging the space between said one surface zone and the preceding surface zone, and a second capacitor electrode portion over said one surface zone, and means for biasing the electrodes at voltages and the surface zones having conductivity to produce at each of the storage sites between said second capacitor electrode and an underlying semiconductive portion when signal carriers are stored thereat a first capacitance value and to produce upon the transfer of said stored signal carriers a second capacitance value, said first capacitance value being substantially greater in magnitude than that of the second capacitance value whereby signal degradation during charge transfer is reduced.

4. Charge transfer apparatus as claimed in claim 3 wherein said first capacitance value is at least three times greater than said second capacitance value.

5. Charge transfer apparatus as claimed in claim 4 wherein said opposite type surface zones each having a thickness and a doping concentration such that it can be depleted substantially throughout its entire thickness during operation in the absence of signal carriers.

6. Charge transfer apparatus as claimed in claim 5 wherein the doping concentration of said surface zone is $10^{17}$ atoms/cm$^3$ or less.

7. Charge transfer apparatus as claimed in claim 6 wherein the said doping concentration varies between approximately $10^{14}$ and $10^{16}$ atoms/cm$^3$.

8. Charge transfer apparatus as claimed in claim 4 wherein said first and second capacitance value producing means comprises a depletion capacitor.

9. Charge transfer apparatus as claimed in claim 4 wherein the said first and second capacitance value producing means comprises an inversion capacitor.

10. Charge transfer device as claimed in claim 4 wherein the second capacitor electrode is D.C. biased with respect to the first transfer electrode.

11. Charge transfer device as claimed in claim 4 wherein each storage site comprises first and second surface zones, a first electrode bridging the first surface zone and the preceding surface zone and a second electrode over the first and the second zone.

12. Charge transfer device as claimed in claim 4 wherein each storage site comprises a surface zone, an electrode over the surface zone and the adjacent semiconductive region, and means for causing depletion substantially throughout the thickness of the surface zone and producing the first and second capacitance values.

13. Charge transfer device as claimed in claim 12 wherein the last named means includes a thinner insulator under the electrode over the surface zone.

14. Charge transfer device as claimed in claim 4 wherein each storage site comprises a first surface zone and the adjacent semiconductive region, a first transfer electrode portion bridging the first surface zone and the preceding surface zone, a second capacitor electrode portion coupled to the first electrode and overlying the semiconductor region adjacent the first surface zone, and means biasing the first and second electrodes to produce the first and second capacitance values.

15. Charge transfer device as claimed in claim 14 wherein means are provided D.C. biasing the second electrode portion with respect to the first electrode portion.

16. Charge transfer device as claimed in claim 14 wherein the first surface zone substantially surrounds the adjacent semiconductor region.

* * * * *